(12) United States Patent
Li et al.

(10) Patent No.: US 6,451,127 B1
(45) Date of Patent: Sep. 17, 2002

(54) CONDUCTIVE PASTE AND SEMICONDUCTOR COMPONENT HAVING CONDUCTIVE BUMPS MADE FROM THE CONDUCTIVE PASTE

(75) Inventors: Li Li, Gilbert; Treliant Fang, Chandler, both of AZ (US)

(73) Assignee: Motorola, Inc., Schaumbrug, IL (US)

( * ) Notice: Subject to any disclaimer, the term of this patent is extended or adjusted under 35 U.S.C. 154(b) by 0 days.

(21) Appl. No.: 09/323,464

(22) Filed: Jun. 1, 1999

(51) Int. Cl.[7] ............................................. B23K 35/363
(52) U.S. Cl. ........................................... 148/23; 148/24
(58) Field of Search .................... 148/25, 23, 24

(56) References Cited

U.S. PATENT DOCUMENTS

| | | | |
|---|---|---|---|
| 4,401,520 A | * 8/1983 | Steppan et al. | 204/11 |
| 4,410,457 A | * 10/1983 | Fujimura et al. | 252/508 |
| 4,695,428 A | 9/1987 | Ballentine et al. | 420/561 |
| 4,758,407 A | 7/1988 | Ballentine et al. | 420/560 |
| 4,806,309 A | 2/1989 | Tulman | 420/562 |
| 4,879,096 A | 11/1989 | Naton | 420/561 |
| 5,156,771 A | * 10/1992 | Yamamoto et al. | 252/512 |
| 5,158,708 A | * 10/1992 | Yamamoto et al. | 252/512 |
| 5,204,025 A | * 4/1993 | Yamada et al. | 252/500 |
| 5,211,764 A | * 5/1993 | Degani | 148/25 |
| 5,328,660 A | 7/1994 | Gonya et al. | 420/562 |
| 5,346,118 A | * 9/1994 | Degani et al. | 228/180.22 |
| 5,410,184 A | 4/1995 | Melton et al. | 257/772 |
| 5,429,292 A | 7/1995 | Melton et al. | 228/180.22 |
| 5,435,857 A | 7/1995 | Han et al. | 148/24 |
| 5,569,433 A | 10/1996 | Chen et al. | 420/557 |
| 5,587,342 A | 12/1996 | Lin et al. | 437/209 |
| 5,661,042 A | * 8/1997 | Fang et al. | 438/17 |
| 5,674,780 A | 10/1997 | Lytle et al. | 437/183 |
| 5,759,737 A | * 6/1998 | Feilchenfeld et al. | 430/311 |
| 5,762,259 A | 6/1998 | Hubacher et al. | 228/180.22 |
| 5,818,699 A | 10/1998 | Fukuoka | 361/760 |
| 5,866,044 A | * 2/1999 | Saraf et al. | 252/519.31 |
| 6,010,956 A | * 1/2000 | Takiguchi et al. | 438/623 |
| 6,139,777 A | * 10/2000 | Omoya et al. | 252/500 |
| 6,174,462 B1 | * 1/2001 | Oka et al. | 252/514 |
| 6,183,669 B1 | * 2/2001 | Kubota et al. | 252/518.1 |

* cited by examiner

*Primary Examiner*—Daniel J. Jenkins
(74) *Attorney, Agent, or Firm*—Kim-Marie Vo

(57) ABSTRACT

A conductive paste composition is described which comprises an alloy of tin and a flux composition. The flux composition comprises an aromatic carboxylic acid fluxing agent and a polymeric solvent.

12 Claims, 1 Drawing Sheet

CONDUCTIVE PASTE AND SEMICONDUCTOR COMPONENT HAVING CONDUCTIVE BUMPS MADE FROM THE CONDUCTIVE PASTE

BACKGROUND OF THE INVENTION

The present invention relates, in general, to electrical interconnects and, more particularly, to interconnect bumps.

Semiconductor manufacturers often form conductive bumps on semiconductor chips to facilitate electrical contact to substrates such as printed circuit boards, Tape Automated Bonding (TAB) substrates, leadframes, etc. Advantages of using conductive bumps include: increased Input and Output (I/O) density, which results in a smaller device "footprint," increased signal propagation speed due to shorter interconnections, reduced vertical profile, and lower device weight.

Typically, the conductive bumps are formed by depositing a layer of masking or stencil material over the substrate, forming openings in the solder mask, disposing a conductive paste in the openings, and reflowing the conductive paste to form the conductive bumps. A disadvantage of presently available conductive pastes is that voids are formed in the conductive bumps after reflowing the conductive paste. These voids weaken the joints between the conductive bumps and the substrates, which result in reliability problems. In addition, residual flux remains after the reflow step that is difficult to remove. This residual flux reduces the adhesive strength between the conductive bumps and the underfill material and increases the device leakage current.

Accordingly, it would be advantageous to have a conductive paste for making conductive bumps and a method for making conductive bumps having a reduced number of voids. It would be of further advantage to be able to form conductive bumps that can be easily and cost efficiently cleaned after reflow.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
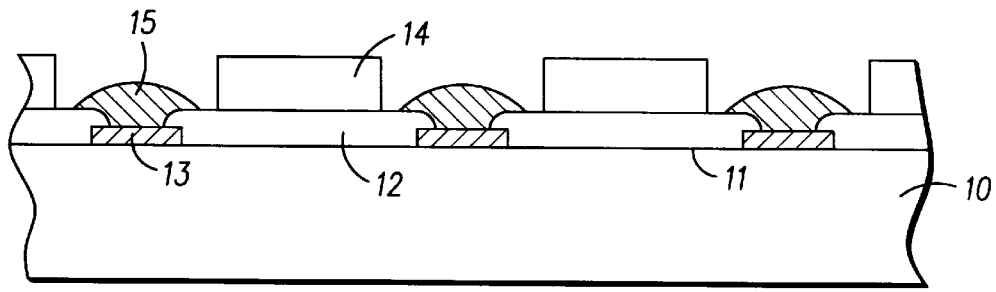
FIG. 1 is a highly enlarged cross-sectional view of a semiconductor wafer at a beginning stage of manufacture in accordance with an embodiment of the present invention.

Generally, the present invention provides a conductive paste, such as, for example, a solder paste, and a method for forming conductive bumps using the conductive paste. Conductive bumps manufactured using the conductive paste of the present invention have fewer voids than those made with presently available conductive pastes. Further, any residual conductive paste that remains after the reflow step can be conveniently removed using water.

In accordance with a first embodiment of the present invention, the conductive paste is formed by combining a tin alloy with a flux composition comprising an aromatic carboxylic acid fluxing agent and a solvent. Suitable tin alloys include: a tin-silver alloy that contains approximately 3.5 weight percent silver (SnAg3.5); a tin-copper alloy that contains approximately 0.7 weight percent copper (SnCu0.7); a tin-silver-bismuth alloy that contains approximately 2 weight percent silver and approximately 2 weight percent bismuth (SnAg2Bi2); a tin-silver-copper alloy that contains approximately 4 weight percent silver and approximately 0.5 weight percent copper (SnAg4Cu0.5); a tin-antimony alloy that contains approximately 5 weight percent antimony (SnSb5); and a tin-lead alloy (SnPb), where the tin content in the tin-lead alloy ranges from approximately 2 weight percent to approximately 70 weight percent. The aromatic carboxylic acid has the general formula:

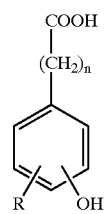

where

R is hydrogen or an alkyl group comprising from 1 to 16 carbon atoms;

and n is an integer ranging from 0 to 3.

The polymeric solvent is a non-boiling polymeric solvent having the general formula:

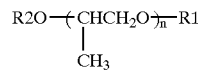

where n is an integer ranging from 6 to 100;

R1 is hydrogen or an alkyl group comprising from 1 to 20 carbon atoms; and

R2 is hydrogen or an alkyl group comprising from 1 to 20 carbon atoms.

Preferably, the fluxing composition comprises approximately 12.5 weight percent 4-hydroxy benzoic acid as the aromatic carboxylic acid fluxing agent and approximately 87.5 weight percent polypropylene glycol ether as the non-boiling polymeric solvent. Further, when using this formula as the flux composition, it is preferable to perform a double reflow step to form the conductive bumps.

In accordance with a second embodiment of the present invention, the conductive paste is formed by combining a tin alloy with a flux composition comprising an aromatic carboxylic acid fluxing agent, a flux carrier, and a solvent. Similar to the first embodiment, suitable tin alloys include: a tin-silver alloy that contains approximately 3.5 weight percent silver (SnAg3.5); a tin-copper alloy that contains approximately 0.7 weight percent copper (SnCu0.7); a tin-silver-bismuth alloy that contains approximately 2 weight percent silver and approximately 2 weight percent bismuth (SnAg2Bi2); a tin-silver-copper alloy that contains approximately 4 weight percent silver and approximately 0.5 weight percent copper (SnAg4Cu0.5); a tin-antimony alloy that contains approximately 5 weight percent antimony (SnSb5); and a tin-lead alloy (SnPb), where the tin content in the tin-lead alloy ranges from approximately 2 weight percent to approximately 70 weight percent. The aromatic carboxylic acid has the general formula:

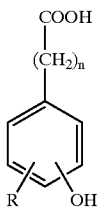

where R is hydrogen or an alkyl group comprising from 1 to 16 carbon atoms; and n is an integer ranging from 0 to 3.

The flux carrier has the general formula:

where n is an integer ranging from 5 to 100.

The polymeric solvent is a non-boiling polymeric solvent having the general formula:

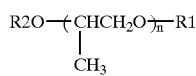

where n is an integer ranging from 6 to 100;

R1 is hydrogen or an alkyl group comprising from 1 to 20 atoms; and

R2 is hydrogen or an alkyl group comprising from 1 to 20 atoms.

Preferably, the fluxing composition comprises approximately 12.5 weight percent 4-hydroxy benzoic acid as the aromatic carboxylic acid fluxing agent, approximately 33.3 weight percent polyethylene glycol, i.e., where n=20, as the flux carrier, and approximately 54.2 weight percent polypropylene glycol ether as the non-boiling polymeric solvent. Further, when using this formulation as the flux composition, it is preferable to use a tin-lead alloy as the metal, wherein the weight percent of tin in the tin-lead alloy ranges from approximately 2 weight percent to approximately 70 weight percent.

In accordance with a third embodiment of the present invention, the conductive paste is formed by combining a tin alloy with a flux composition as described in the second embodiment, except that the flux of the third embodiment contains a mixture of aromatic and aliphatic acids. The aliphatic acid has the general formula:

where n is an integer ranging from 0 to 16.

Similar to the second embodiment, the fluxing composition comprises approximately 12.5 weight percent 4-hydroxy benzoic acid as the aromatic carboxylic acid fluxing agent, approximately 33.3 weight percent polyethylene glycol, i.e., n=20, as the flux carrier, and approximately 54.2 weight percent polypropylene glycol butyl ether as the non-boiling polymeric solvent.

In accordance with a fourth embodiment of the present invention, the conductive paste is formed by combining a tin alloy with a flux composition comprising an aromatic carboxylic acid fluxing agent, a flux carrier, a secondary flux, and a solvent. Similar to the first and second embodiments, suitable tin alloys include: a tin-silver alloy that contains approximately 3.5 weight percent silver (SnAg3.5); a tin-copper alloy that contains approximately 0.7 weight percent copper (SnCu0.7); a tin-silver-bismuth alloy that contains approximately 2 weight percent silver and approximately 2 weight percent bismuth (SnAg2Bi2); a tin-silver-copper alloy that contains approximately 4 weight percent silver and 0.5 weight percent copper (SnAg4Cu0.5); a tin-antimony alloy that contains approximately 5 weight percent antimony (SnSb5); and a tin-lead alloy (SnPb), where the tin content of the tin-lead alloy is ranges from approximately 2 weight percent to approximately 70 weight percent. The aromatic carboxylic acid has the general formula:

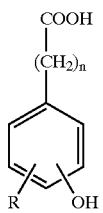

where R is hydrogen or an alkyl group comprising from 1 to 20 carbon atoms; and n is an integer ranging from 0 to 3.

The flux carrier has the general formula:

where n is an integer ranging from 5 to 100.

The secondary flux has the general formula:

where n is an integer ranging from 0 to 16.

The polymeric solvent is a non-boiling polymeric solvent having the general formula:

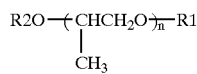

where n is an integer ranging from 6 to 100;

R1 is hydrogen or an alkyl group having from 1 to 18 carbon atoms; and

R2 is hydrogen or an alkyl group having from 1 to 18 carbon atoms.

Preferably, the fluxing composition comprises 17 weight percent 4-hydroxy benzoic acid as the aromatic carboxylic acid fluxing agent, 12 weight percent polyethylene glycol as the flux carrier, 6 weight percent adipic acid as the secondary flux carrier, and 65 weight percent polypropylene glycol ether as the non-boiling polymeric solvent.

Techniques for combining the constituents of the flux composition and the metal alloy are known to those skilled in the art.

FIG. 1 is a highly enlarged cross-sectional view of a semiconductor wafer 10 having a surface 11 and a plurality of bond pads 13 formed on surface 11. In addition, a layer 12 of dielectric material is formed on surface 11 and portions of bond pads 13. Optionally, an underbump metallization layer 15 is formed on bond pads 13. Techniques for forming bond pads on the surface of a semiconductor wafer and underbump metallization on a bond pad are well known to those skilled in the art. Further, it is well known that semiconductor wafers are comprised of a plurality of semiconductor chips that contain circuit elements such as transistors, diodes, integrated circuits, passive elements, etc. Bond pads 13 and underbump metallization layers 15 make electrical contact to the appropriate regions of the integrated circuit or semiconductor device. It should be noted that the circuit elements are not shown in FIG. 1.

Still referring to FIG. 1, a layer of solder mask material 14 is formed on surface 11 and bond pads 12. Solder mask layer 14 is patterned such that underbump metallization layers 15 are exposed. It should be understood the use of a layer of solder mask material is not a limitation of the present invention. For example, a mechanical stencil or the like may be used rather than a layer of solder mask material.

Figure 2:
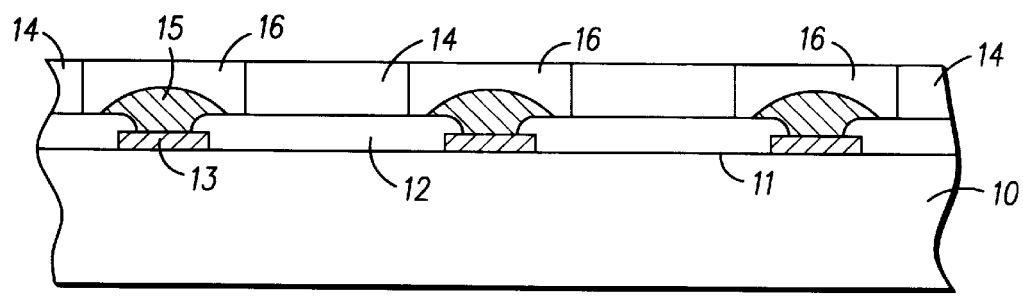
FIG. 2 is a highly enlarged cross-sectional view of the semiconductor wafer of FIG. 1 during manufacture.

Now referring to FIG. 2, a conductive paste 16, formulated in accordance with the present invention, is applied to the solder mask layer 14 and into the openings in solder mask layer 14. Preferably, conductive paste 16 is dispensed, spread, or flooded on the surface of solder mask layer 14 in order to roughly cover the surface of semiconductor wafer 10. A squeegee (not shown) or other suitable instrument is used to sweep conductive paste 16 across solder mask layer 14 and to substantially fill the openings in solder mask layer 14. Excess conductive paste is removed from the surface of solder mask layer 14.

Figure 3:
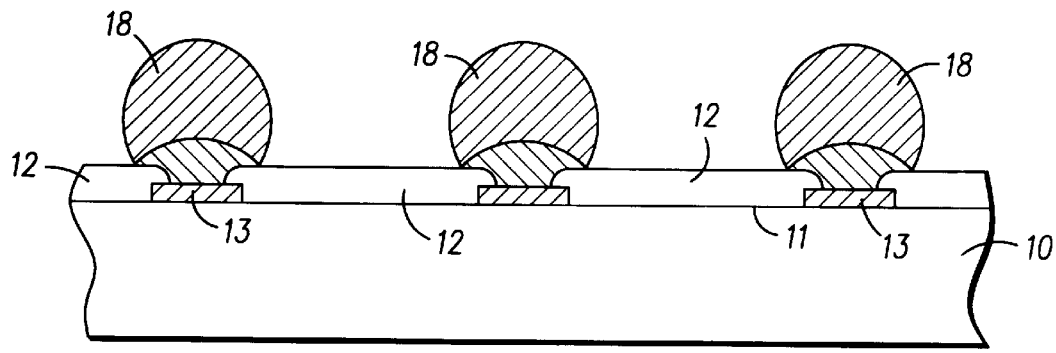
FIG. 3 is a highly enlarged cross-sectional view of the semiconductor wafer of FIG. 1 having conductive bumps formed thereon in accordance with an embodiment of the present invention.

Now referring to FIG. 3, the solder mask is removed and the conductive paste reflowed to form conductive bumps 18. Conductive bumps 18 are also referred to as solder bumps. The conductive bumps are then cleaned using water to remove the flux residue.

Although conductive bumps 16 are shown and described as being formed on a semiconductor wafer, it should be understood this is not a limitation of the present invention. For example, the conductive bumps can be formed on printed wire boards, flex circuits, metallized ceramic or glass, or the like.

By now it should be appreciated that a conductive paste and a method for using the conductive paste have been provided. The conductive paste of the present invention produces conductive bumps having fewer voids than conventional solder pastes. One reason for the reduction in the number of voids is the formation of hydrogen bonds between the hydroxyl and carboxyl groups on the aromatic carboxylic acid fluxing agent and the alkoxy groups on the solvent such that a very high flux concentration can be used in the paste. Another advantage of the present invention is that residual flux can be easily cleaned using water. In addition, to reducing the cost for cleaning the conductive bumps, the use of water is a much more environmentally benign system.

What is claimed is:

1. A conductive paste composition, comprising:

an alloy of tin (Sn) and;

a flux composition, wherein the flux composition comprises:

a fluxing agent, which is an aromatic carboxylic acid; and a polymeric solvent.

2. The conductive paste composition of claim 1, wherein the fluxing agent has the general formula:

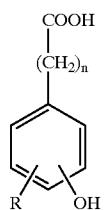

where R is one of hydrogen or an alkyl group comprising from 1 to 16 carbon atoms, and n is an integer selected from the group of integers ranging from 0 to 3.

3. The conductive paste composition of claim 2, wherein the fluxing agent is 4-hydroxy benzoic acid (n=0, R=H).

4. The conductive paste composition of claim 3, further including a flux carrier, wherein the flux carrier has the general formula:

$$HO\text{-}(CH_2CH_2O)_n\text{-}H$$

where n is an integer selected from the group of integers ranging from 5 to 100.

5. The conductive paste composition of claim 4, wherein the flux carrier is polyethylene glycol, wherein the integer n is selected from the group of integers ranging from 5 to 20.

6. The conductive paste composition of claim 3, further including another fluxing agent, the another fluxing agent having the general formula:

$$HOOC\text{-}(CH_2)_n\text{-}COOH$$

where n is an integer selected from the group of integers ranging from 0 to 16.

7. The conductive paste composition of claim 6, wherein the another fluxing agent is adipic acid.

8. The conductive paste composition of claim 3, wherein the solvent has the general formula:

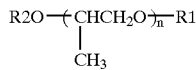

where n is an integer selected from the group of integers ranging from 6 to 100, R1 is one of hydrogen or an alkyl group comprising from 1 to 18 carbon atoms, and R2 is one of hydrogen or an alkyl group comprising from 1 to 18 carbon atoms.

9. The conductive paste composition of claim 8, wherein the solvent is polypropylene glycol butyl ether (n=65, R1=H, R2=C4H9).

10. The conductive paste composition of claim 1, wherein the fluxing agent is mixed with an acid having the general formula:

$$HOOC\text{-}(CH2)_n\text{-}COOH$$

where n is an integer selected from the group of integers ranging from 0 to 16.

11. The conductive paste composition of claim 10, wherein the acid is an aliphatic acid.

12. The conductive paste composition of claim 1, wherein the alloy of tin is selected from the group consisting of a tin-silver alloy, a tin-copper alloy, a tin-silver-bismuth alloy, and a tin-antimony alloy, a tin-lead alloy.

* * * * *